United States Patent [19]

Bethurum

[11] Patent Number: 5,477,421

[45] Date of Patent: Dec. 19, 1995

[54] SHIELDED IC CARD

[75] Inventor: Gary C. Bethurum, Laguna Niguel, Calif.

[73] Assignee: ITT Corporation, New York, N.Y.

[21] Appl. No.: 154,318

[22] Filed: Nov. 18, 1993

[51] Int. Cl.$^6$ ............................... H05K 9/00; H05K 1/14
[52] U.S. Cl. ..................... 361/818; 235/380; 235/492; 361/737; 361/742; 361/758
[58] Field of Search ...................... 235/488, 380, 235/492; 361/737, 742, 752, 753, 758, 816–818; 174/35 R, 35 MS

[56] References Cited

U.S. PATENT DOCUMENTS

| | | |
|---|---|---|
| 4,138,711 | 2/1979 | Bremenour et al. . |
| 4,226,491 | 10/1980 | Kazama et al. . |
| 4,678,699 | 7/1987 | Kritchevsky et al. ................... 428/175 |
| 4,681,712 | 7/1987 | Sakakibara et al. ....................... 264/24 |
| 4,889,498 | 12/1989 | Mizuta ..................................... 439/86 |
| 4,924,076 | 5/1990 | Kitamura . |
| 4,939,623 | 7/1990 | Equi et al. . |
| 4,980,223 | 12/1990 | Nakano et al. ........................... 428/198 |
| 5,038,250 | 8/1991 | Uenaka et al. . |
| 5,061,845 | 10/1991 | Pinnavaia ................................. 235/492 |
| 5,111,362 | 5/1992 | Flamm et al. . |
| 5,144,533 | 9/1992 | Annett . |
| 5,150,282 | 9/1992 | Tomura et al. . |
| 5,153,818 | 10/1992 | Mukougawa et al. . |
| 5,170,009 | 12/1992 | Kadokura . |
| 5,207,586 | 5/1993 | MacGregor et al. ...................... 439/76 |
| 5,242,310 | 9/1993 | Leung ...................................... 439/76 |

FOREIGN PATENT DOCUMENTS

| | | |
|---|---|---|
| 0532160 | 7/1992 | European Pat. Off. . |
| 0546680 | 6/1993 | European Pat. Off. . |
| 2139017 | 4/1983 | United Kingdom . |

*Primary Examiner*—Bot L. Ledynh
*Attorney, Agent, or Firm*—Freilich Hornbaker Rosen

[57] ABSTRACT

An IC card is described which has a housing that is of low cost and which provides very good shielding against ESD/EMI (electrostatic discharge and electromagnetic interference), while securely holding a circuit board assembly and providing good contact with a ground conductor of the board. The housing comprises lower and upper housing halves (22, 24, FIG. 2), each molded of an electrically conductive polymer. The lower housing, half includes a bottom cover portion (90) and a pair of upstanding flanges (92, 94) that each forms part of a side of the housing. The upper housing half forms a top cover portion (100) and a pair of downwardly extending flanges (102, 104). The circuit board has a ground conductor (70) at its periphery which is trapped between the upper and lower housing halves to securely hold the circuit board in place and to electrically ground its ground conductor. Each housing half has platform parts (114, 116, 120, 122) that engage corresponding surfaces of the circuit board. The platform parts are staggered along the length of each housing side, to slightly bend each circuit board side and thereby hold the circuit board in place while assuring good electrical contact therewith.

13 Claims, 4 Drawing Sheets

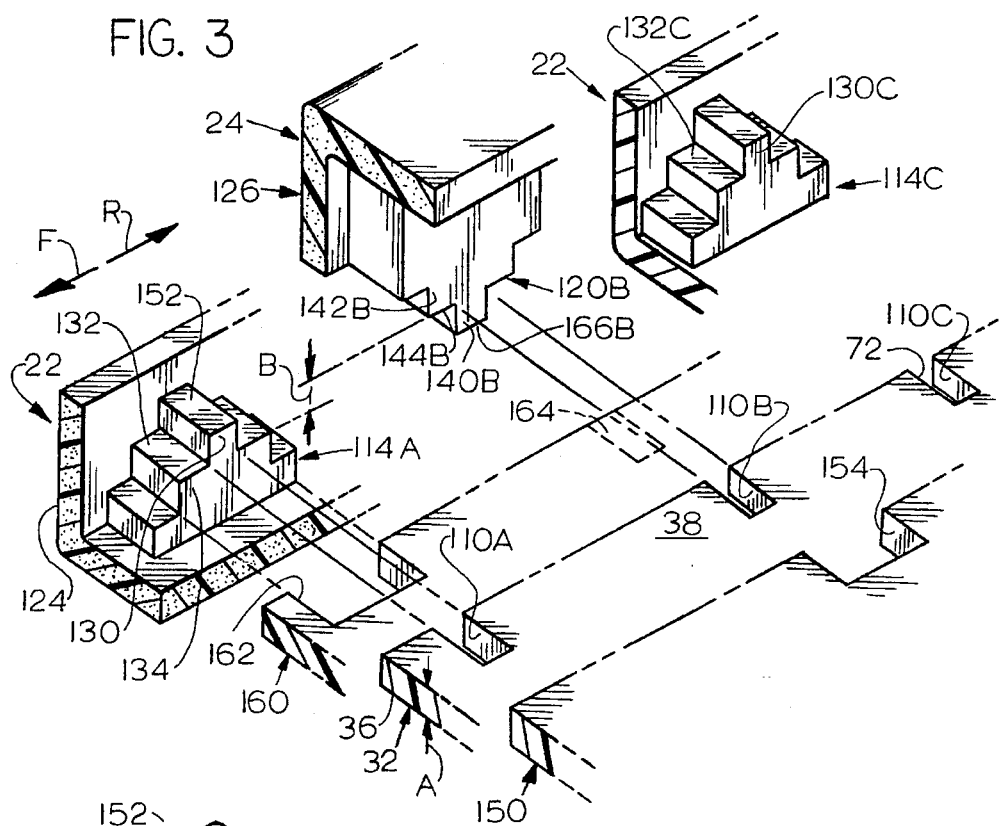
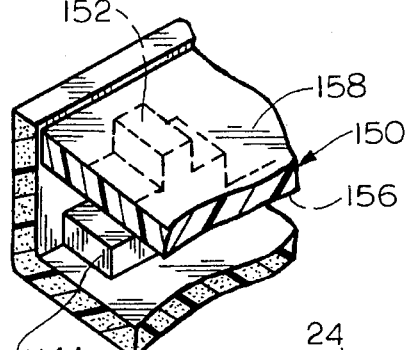
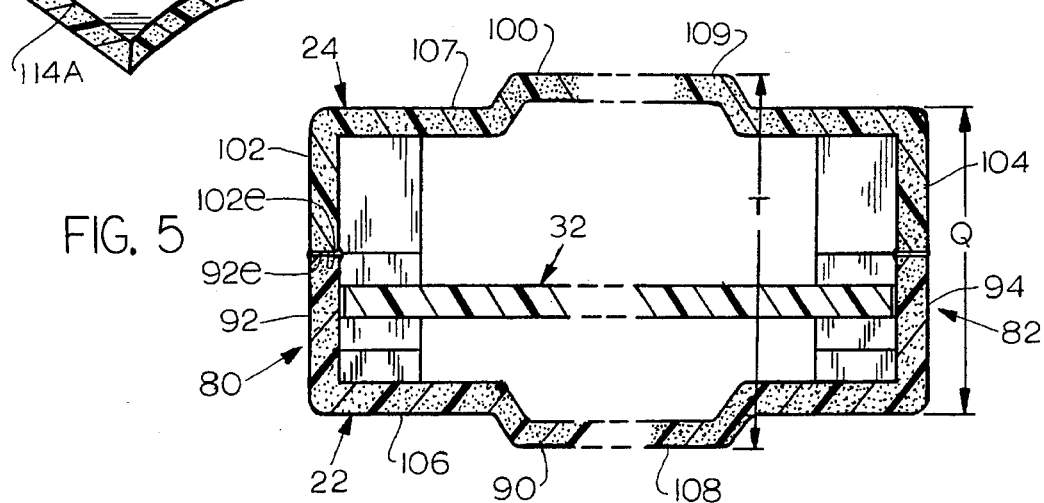

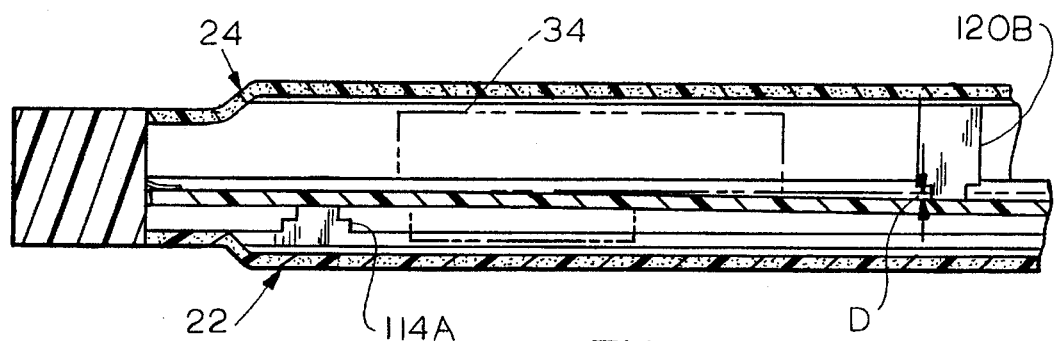
FIG. 6
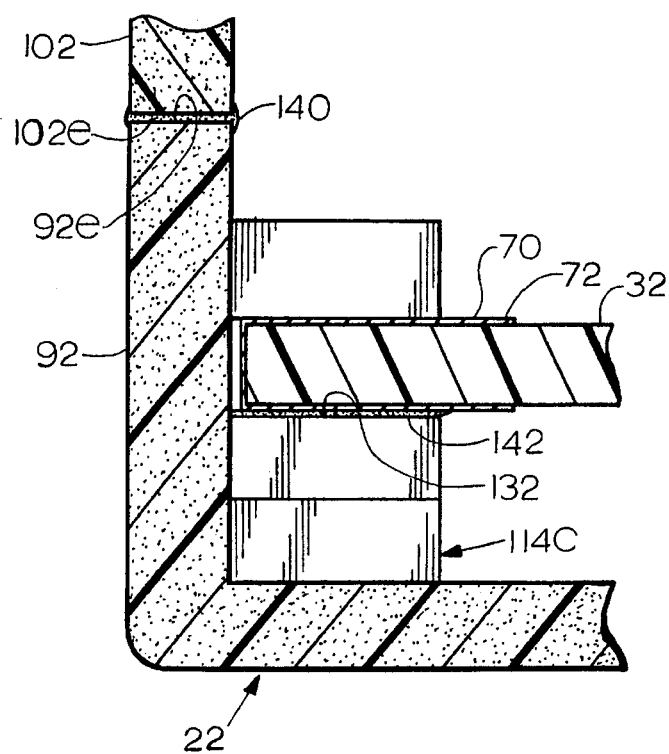
FIG. 7
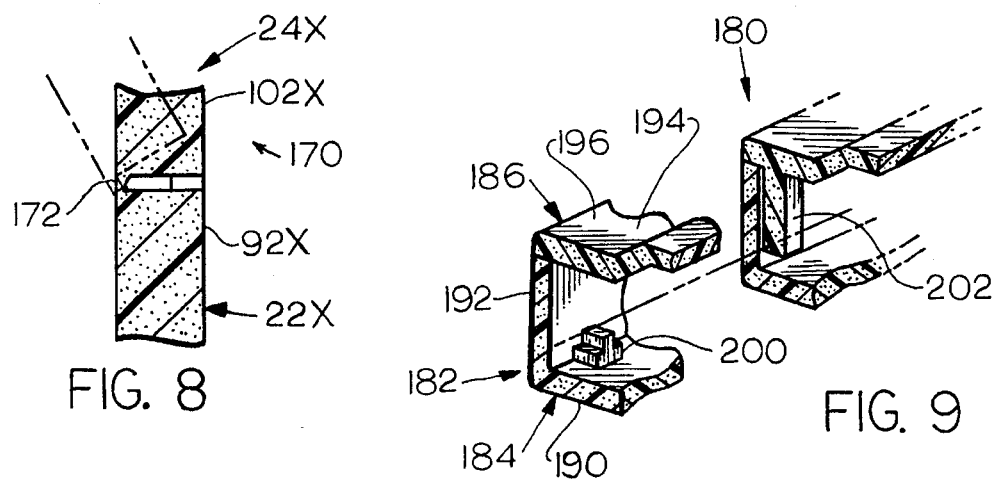
FIG. 8
FIG. 9

SHIELDED IC CARD

BACKGROUND OF THE INVENTION

IC cards, which are often memory cards, are commonly constructed with a molded plastic frame on which a circuit board assembly is mounted, with a connector attached to the front and/or rear of the frame. Top and bottom metallic covers are mounted on the molded frame to provide EMI (electromagnetic interference) shielding. One card specification requires a card length of 3.370 inch, a width of 2.126 inch, and a thickness of 0.190 inch. Thus, the card thickness is less than one tenth of the width or length, and metallic covers at just the top and bottom (not at the sides) provide relatively good EMI shielding. The frame that lies between the covers is molded to provide various grooves and notches for mounting of the circuit board, connectors, and covers. A piece of sheet metal may be wrapped about locations at the sides of the frame and connected to the circuit board ground plane, to enable discharge of static electricity as the circuit board is inserted into an electronic device. The many parts of the IC card which must be separately fabricated and assembled, result in an increased cost for the card and reduce reliability. An IC card which could be constructed with a minimum number of different integral components, could reduce the cost and increase the reliability of the card.

SUMMARY OF THE INVENTION

In accordance with one embodiment of the present invention, an IC card is provided which has a reduced number of parts and increased reliability. The card includes a housing having a thickness much less than its width or length, and a circuit board mounted in the housing. The housing includes lower and upper housing halves, each formed of molded electrically conductive polymer material, with the lower half forming a bottom cover and the upper half forming the upper cover. The housing halves form the opposite vertical sides of the housing, which separate the upper and lower cover portions, and which close opposite sides of the card. The cover portion and any side portion of each housing half is integrally molded, so only two housing halves have to be clamped together around the circuit board.

The lower housing half has a plurality of lower platform parts spaced along at least a first side thereof. Each lower platform part forms an upwardly-facing surface for supporting the lower surface of the circuit board assembly. The upper housing half has at least one upper platform part with a downwardly-facing surface which engages the upper surface of the circuit board assembly. The platform parts of the lower and upper housing halves are staggered along the first side, and are positioned to cause slight bending of the card. This causes the platform parts to firmly position and electrically engage a ground conductor at the edge portion of the circuit board of the circuit board assembly. Each platform part can have a plurality of steps to securely hold the circuit board at a plurality of different heights, and the circuit board has corresponding slots to receive steps of the platforms.

The novel features of the invention are set forth with particularity in the appended claims. The invention will be best understood from the following description when read in conjunction with the accompanying drawings.

BRIEF DESCRIPTION OF THE DRAWINGS

FIG. 3 is an exploded isometric view of sections of a side portion of the lower and upper housing halves, and also showing three different embodiments of a circuit board which can be mounted on the housing halves.

FIG. 4 is a partial isometric view of a portion of the lower housing half and one of the circuit boards of FIG. 3, shown assembled.

FIG. 5 is a partial sectional view taken on the line 5—5 of FIG. 1.

FIG. 6 is a partial sectional view taken on the line 6—6 of FIG. 1.

FIG. 7 is an enlarged view of a portion of FIG. 5.

FIG. 8 is a partial sectional view of an IC card constructed in accordance with another embodiment of the invention.

FIG. 9 is a partial exploded isometric sectional view of an IC card constructed in accordance with another embodiment of the invention.

DESCRIPTION OF THE PREFERRED EMBODIMENTS

Figure 1:
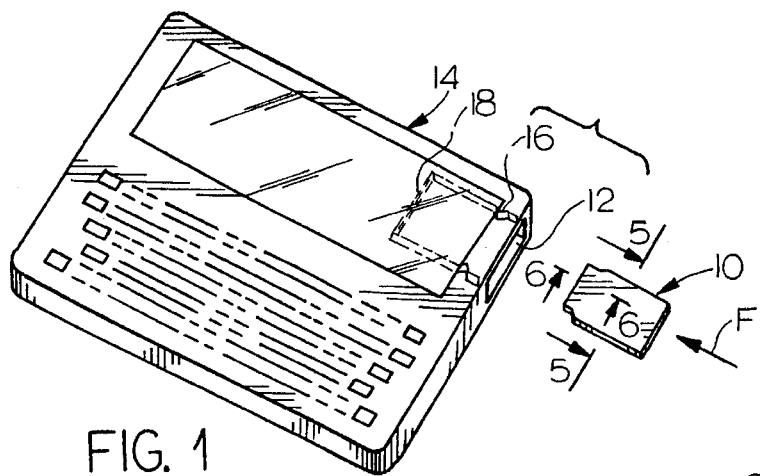
FIG. 1 is an isometric view of an IC card and an electronic device in the form of a lap top computer, constructed in accordance with the present invention.

FIG. 1 illustrates an IC (integrated circuit) card 10 of the present invention, that is adapted to be inserted in a forward direction F into a slot 12 of an electronic device 14. The particular electronic device shown is a lap top computer having the width and length of a sheet of common notebook paper, and with a relatively small thickness. When the card is inserted into the slot, a pair of grounding contacts 16 wipe the opposite sides of the card. The grounding contacts discharge any static electricity before a connector at the front of the card mates with a connector 18 at the end of the slot.

Figure 2:
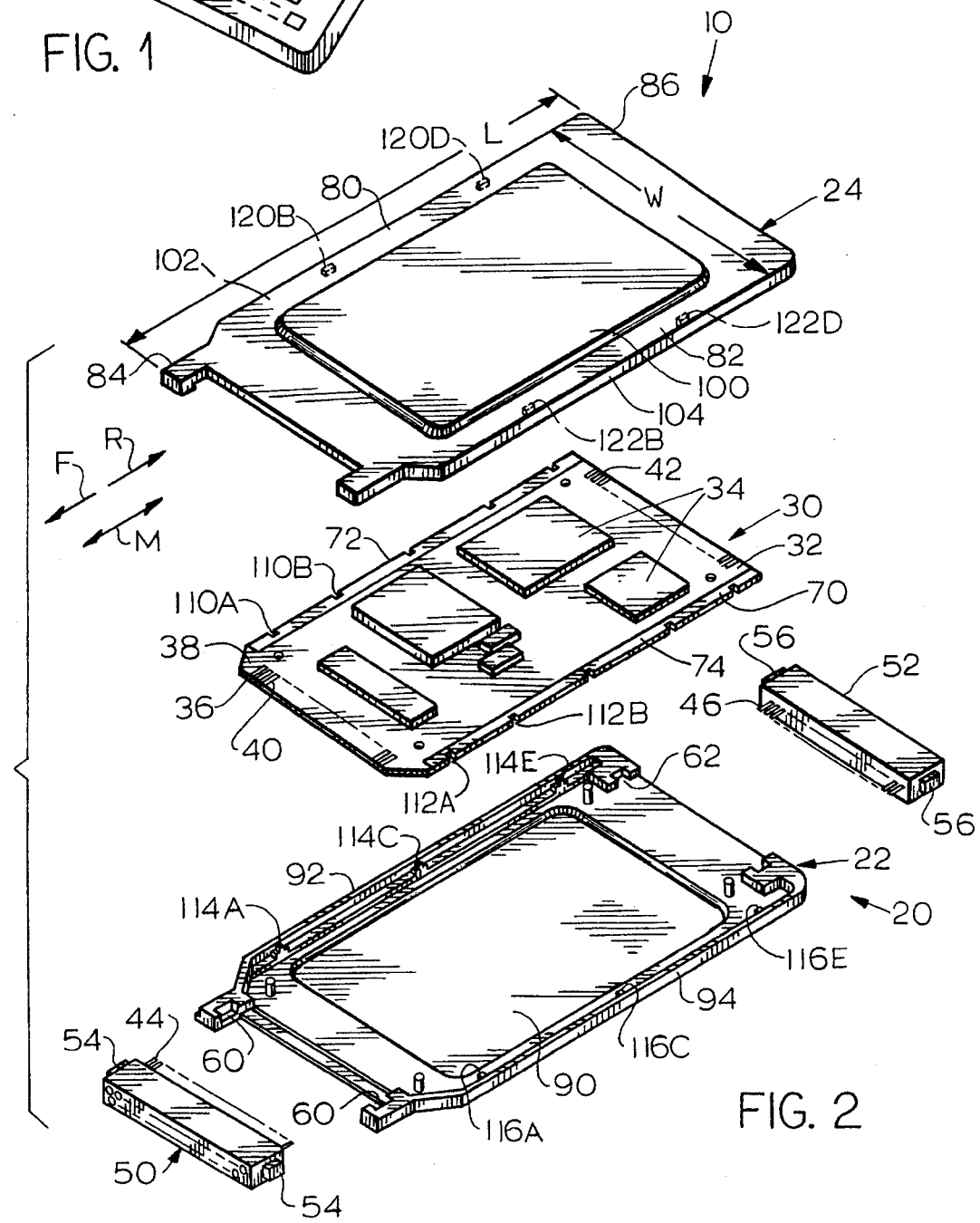
FIG. 2 is an exploded isometric view of the IC Card of FIG. 1.

As shown in FIG. 2, the IC card 10 includes a housing 20 that comprises first and second or lower and upper housing parts or halves 22, 24. A circuit board assembly 30 which lies within the housing, includes a circuit board 32 and components 34 mounted on the circuit board. The components typically include active components such as IC's (integrated circuits), resistors, capacitors, etc. and passive components or conductors in the form of wires or conductive traces on the circuit board faces that interconnect the active components. The circuit board has lower and upper faces or surfaces 36, 38 and the components can be mounted on both surfaces. The circuit board has rows 40, 42 of conductive pads at its opposite ends which are soldered to contact tails 44, 46 of front and rear connectors 50, 52.

The IC card is assembled by first soldering the contact tails 44, 46 to the rows of contact pads 40, 42 of the circuit board. Then the circuit board with the connectors thereon is placed on one of the housing halves such as the lower one 22, with ears 54, 56 of the connectors received in notches 60, 62 at the ends of the housing half. The Upper housing half 24 is closed over the lower one and the housing halves are sealed together to complete the IC card.

The circuit board 32 has a ground conductor 70 which may be in the form of a ground plane, with exposed opposite side portions 72, 74 that lie at opposite side potions of the card on both its upper and lower surfaces. The circuit board must be accurately and securely mounted in the housing, with the circuit board surrounded in almost all directions by electrically conductive portions of the housing to guard against EMI (electromagnetic interference). Also, the ground conductor 70 of the circuit board usually must be electrically connected to conductive portions at opposite sides of the housing to enable static discharge when the card is inserted into an electronic device.

The housing has width-spaced opposite sides 80, 82 spaced by a maximum width dimension W (of 2.126 inch), and has length-spaced front and rear ends 84, 86 spaced by a maximum length dimension L (of 3.370 inch) in a longitudinal direction M. The housing also has a thickness-spaced top and bottom and a maximum thickness dimension T (FIG. 5, of 0.190 inch). The lower housing half 22 (FIG. 2) forms a bottom cover portion 90 and a pair of upstanding flanges 92, 94 at opposite sides of the lower cover portion. Similarly, the upper housing half 24 has a top cover portion 100 and has opposite depending flanges 102, 104 extending downwardly at opposite sides of the housing. When the lower and upper housing halves are joined, the flanges of the lower and upper housing halves abut one another and form a space between the cover portion in which the circuit board assembly 30 is received. Each cover portion 90, 100 has a peripheral portion 106, 107, and has a center portion 108, 109, with the secondary thickness Q between the peripheral portions being less than the maximum card thickness T.

The circuit board 32 has groups of longitudinally-spaced slots 110, 112 at its opposite sides, which are labeled 110A, 110B, etc. and 112A, 112B etc. The lower housing half has a group of longitudinally-spaced lower platform parts 114, 116 as its opposite sides, which are labeled 114A, 114C, 114E, and 116A, 116C, and 116E which receive corresponding slots on the circuit board. The upper housing half has spaced upper platform parts 120, 122 which are labeled 120B, 120D and 122B, 122D and which engage corresponding slots on the circuit board. As described below, the platform parts accurately locate the circuit board both horizontally and vertically, while preventing, it from "rattling", and while providing good electrical contact with the ground conductor of the circuit board.

FIG. 3 shows portions of the lower and upper housing parts 22, 24 and a portion of the circuit board 32 of FIG. 2. Each of the flanges such as the lower flange 92 includes an outer wall 124, with the platform parts lying inside the outer wall. The upper flange 102 is similarly constructed with an outer wall 126. The lower platform part 114A has an uppermost or first step 130 which is received in a corresponding slot 110A of the circuit board 32. The lower face 36 of the circuit board lies on an interrupted board-receiving surface 132 of a second step 134 of the platform part. Thus, the slot 110A of the circuit board is used to fix the horizontal position of the circuit board in forward and rearward directions F, R, while the lower surface 36 of the circuit board is vertically supported. Other lower platforms such as 114C have steps 130C and upwardly-facing surfaces 132C that support other locations along the circuit board side 72. The upper platform parts such as 120B have lowermost or first steps such as 140B which are received in corresponding circuit board slots such as 110B. The upper platform part also has a second platform step 142B forming a downwardly-facing board-engaging surface 144B. The downwardly-facing surface 144B presses against the upper surface 38 of the circuit board 32.

The circuit board 32 has a predetermined thickness A, and the difference B in heights of the board-engaging surfaces 132 and 144B in the assembled card, is slightly less than the circuit board thickness A. As a result, the portion of the circuit board around the slot 110B is downwardly deflected, as compared to the flat orientation which the board assumes in the absence of the upper platform part 120B. The resulting slight bend of the circuit board results in the circuit board pressing firmly against the platform surfaces 132, 144B, 132C, etc. In one IC card that applicant designed, with overall dimension described above, the circuit board had a thickness A of 0.050 inch, and the board-engaging surfaces had a height difference B of 0.045 inch, for a difference D (FIG. 6) of 0.005 inch. The upper and lower platform parts such as 114A and 120B were longitudinally spaced apart by 0.65 inch.

FIG. 5 is a sectional view of the assembled IC card, although only the circuit board 32 of the circuit board assembly is shown. It can be seen that the corresponding flanges 92, 102 of the lower and upper housing halves 22, 24 engage each other, by means of the ends 92e, 102e of the flanges substantially abutting one another. The other flanges 94, 104 are similarly connected together. The flanges of the lower and upper housing halves form substantially the entire height of the sides 80, 82 of the housing of the IC card.

Each of the housing halves 22, 24 is molded of an electrically conductive polymer (or group of polymers), with the lower flanges 92, 94 being integrally molded with the lower cover portion 90, and with the upper flanges 102, 104 being molded integrally with the upper cover portion 100. A variety of electrically conductive materials are known, which often include multiple particles or fibers of conductive material, such as silver, imbedded in a dielectric plastic material such as a polyester. The electrical resistivity of a molded plastic (i.e, polymer) material is much higher than that of some metals such as silver and copper with such electrically conductive plastic having a bulk resistivity that is about two orders of magnitude greater than that of copper (whose electrical resistivity is 1.7 microhm-centimeter). However, the resistivity of such conductive plastic material is moderate, and is considered to be electrically conductive when its resistivity is less than four orders of magnitude greater than that of copper. It is possible to embed a thin metal sheet or foil in each housing half when molding it, although each housing haft is still formed primarily of a conductive polymer.

An important advantage of the construction shown in FIG. 5, is that this results in the housing being formed of only two parts. Prior common IC cards included a frame which was molded of polymer material, and metal plates forming top and bottom covers. Also, some prior IC cards had pieces of sheet metal surrounding locations at the opposite sides of the plastic frame to discharge static electricity. Each piece of sheet metal had an inner part contacting the ground plane of the circuit board and an outer part for engaging contacts of the electronic device to discharge static electricity. Applicant's use of only two parts which are assembled, as compared to the above-described five separate parts which had to be separately fabricated and then assembled, can result in a lower cost housing and one which is more reliable. A further advantage is that the electrically conductive halves provide electrically conductive sides for the housing, to avoid EMI (electromagnetic interference) which might pass through the narrow sides of the card. The circuit board is securely held in place against "rattling" by the platform parts of the lower and upper housing halves, and these platform parts also provide contact of each of the housing halves with the circuit board ground conductor.

FIG. 7 is an enlarged view of a portion of FIG. 5, showing one side 72 of the ground conductor 70 of the circuit board 32, and showing the substantially abutting edges 92e, 102e of the flanges 92, 102. FIG. 7 shows a quantity of electrically conducted adhesive 140 which joins the flange ends to seal them against the entrance of dirt while providing good electrical contact between them. Other joining techniques can be used, such as the welding of abutting or overlapping ends to each other. FIG. 7 also shows a quantity of conductive paste 142 which has been placed on the board-engaging surface 132 of a platform part 114C to assure better electrical contact between the ground conductor 70 and the housing lower half 22.

FIG. 3 not only shows circuit board 32, but shows another, alternative circuit board 150 which is designed to rest on a top board-engaging surface 152 of the lower platform part 114A. The circuit board 150 has a slot 154 which receives the second step 142B of the upper platform part 120B so the upper platform part can press down on the circuit board at a region immediately surrounding the spot 154. FIG. 4 shows the circuit board 150 lying on the surface 152 of the lower platform part 114A. The advantage of this arrangement is that it provides more room below the lower surface 156 of the circuit board, although it results in less room above the upper surface 158. This arrangement allows somewhat taller components to be mounted on the lower surface 156 of the board, although it may require somewhat shorter components on the upper surface.

FIG. 3 shows another alternate circuit board 160 which has a wide slot 162 which receives the second step 134 of the lower platform part 114A. The circuit board 160 has a region at 164 which is pressed down by a lower surface 166B of the upper platform part 120B. The circuit board 160 results in the greatest height above the circuit board. It is noted that circuit board components are available in a range of sizes, with those of larger heights often being less expensive than those of smaller heights, especially in the case of integrated circuits. The ability to vary the available height above and below the circuit board, enables the use of circuit components of a total minimal cost. It is noted that simple slots of the type shown for the circuit boards of FIG. 3, are easily formed.

FIG. 8 illustrates a portion of another IC card housing 170, which is similar to that of FIG. 5, except that the lower and upper flanges 92X, 102X are joined at 172 in a "living hinge". Although the lower and upper housing parts 22X, 24X are integrally molded, they are substantially separate parts, in that they are joined only at the thin joint 172 at one side, while the other side is separate in the same manner as in FIG. 5.

FIG. 9 illustrates another IC card 180, wherein the housing 182 includes lower and upper housing halves 184, 186 that are each integrally molded. The lower housing half 184 includes a bottom cover portion 190 and flanges such as 192 at its opposite sides. The upper housing half 186 includes a top cover portion 194, but does not have a full vertically extending flange. The top cover portion has a peripheral region 196 joined to the top of the flange 192. It is possible for the other side of the housing (not shown) to include an upwardly extending flange similar to 192, or a downwardly-extending flange that extends down from the opposite Side of the upper housing half 186. The housing has lower and upper platform parts 200, 202 which are staggered and which trap the circuit board between them, in substantially the same manner as indicated in FIG. 3. The upper platform part 202 is relatively tall because it extends from the cover part 194 of the upper housing half, and therefore the upper platform part 202 may be considered to be a downwardly-extending flange.

Figure 10:
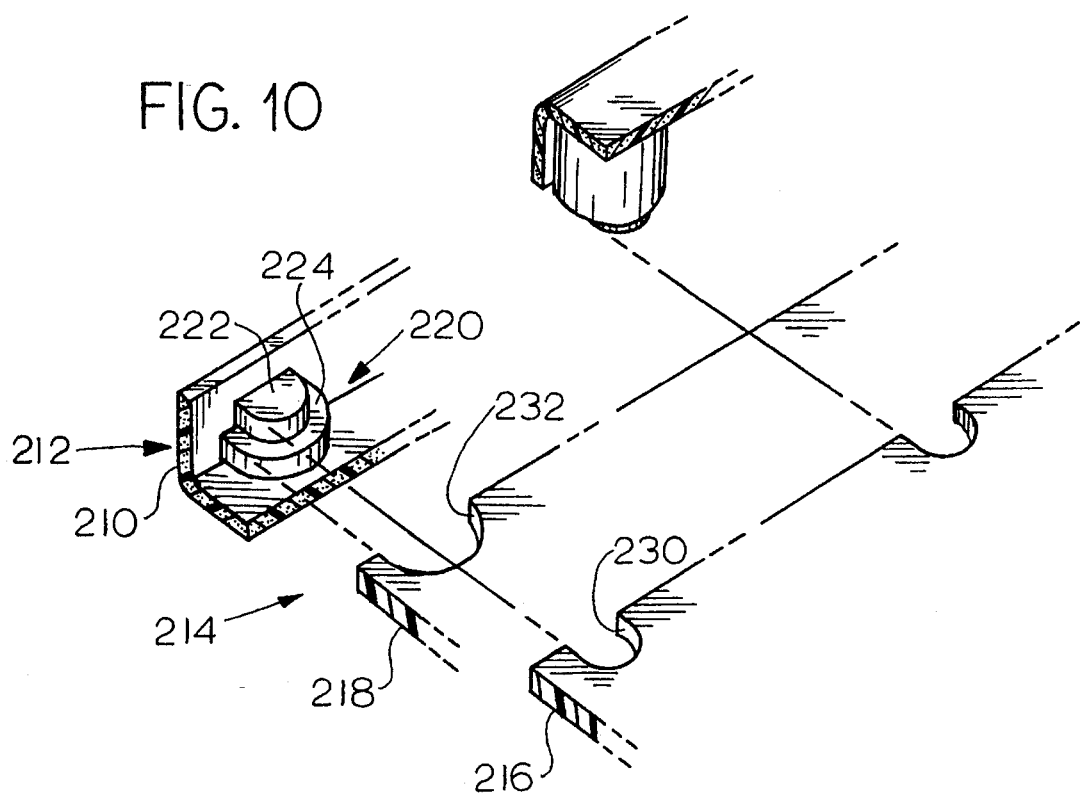
FIG. 10 is a partial exploded isometric view of a lower housing half and two different embodiments of a circuit board which can be mounted therein, which are constructed in accordance with another embodiment of the invention.

FIG. 10 illustrates the lower half 210 of the housing 212 of another IC card 214, and two circuit boards 216, 218 which can be alternately mounted on the housing. The housing lower half has platform parts such as 220 with steps 222, 224. The circuit board 216 has slots 230 that receive steps 222. The alternate circuit board 218 has Slots 232 that receives steps 224. The arrangement is the same as that of FIG. 3, except that the inner ends of the steps are rounded, as by a half circle, and the circuit board slots are similarly rounded. The rounding of the circuit board slots avoids stress concentrations in the circuit board, to provide high reliability using thin circuit boards. The platforms could be in the form of posts and the circuit board slots could be in the form of holes to receive the posts.

It is noted that terms Such as "upper", "lower", "vertical", etc. have been used to aid in the description of the invention as illustrated. However, the IC card and it parts can be used in any orientation with respect to earth's gravity.

Thus, the invention provides an IC card which can be constructed at low cost and which is of high reliability. The card housing includes lower and upper housing halves respectively forming lower and upper cover portions of the housing and forming the opposite sides of the housing. At least a first housing half is integrally molded and forms at least half of a side as well as one of the cover portions. Each of the housing halves is formed of electrically conductive material, preferably an electrically conductive polymer. The sides of the housing halves include platform parts which support the circuit board. Lower and upper platform parts are preferably staggered along the length of each side, and positioned to slightly deflect the circuit board edge to prevent rattling of the circuit board and assure good contact with the lower and upper housing halves. The platforms can have a plurality of steps of different height, so the same housing can be used with different circuit boards which require different amounts of space above and below the circuit board.

Although particular embodiments of the invention have been described and illustrated herein, it is recognized that modifications and variations may readily occur to those skilled in the art, and consequently, it is intended that the claims be interpreted to cover such modifications and equivalents.

I claim:

1. An IC card which includes width-spaced opposite sides, length-spaced front and rear ends, and thickness-spaced top and bottom cover portions, wherein said thickness is much less than said width and than said length, characterized by:

a housing which comprises first and second housing halves, with said first housing half integrally forming a first of said cover portions and at least about half of one of said sides, and said second housing half forming the second of said cover portions;

a circuit board assembly lying in said housing and including a circuit board with upper and lower board surfaces and opposite sides and with a ground conductor at said sides of said board lower surface;

said first housing half has opposite sides and has platform parts at said sides with said platform parts having upwardly-facing board-supporting surfaces that firmly engage the ground conductor on said circuit board lower surface, said housing halves, including said platform parts of said first housing half, being formed of electrically conductive material, to thereby firmly support and electrically ground said circuit board.

2. An IC card which includes a housing, a circuit board assembly lying in said housing, said circuit board assembly including a circuit board having upper and lower faces and a plurality of components mounted on said board and projecting from at least one face thereof, and said housing including upper and lower portions, laterally-spaced first and second opposite sides and longitudinally spaced first and second opposite ends, characterized by:

said housing lower portion includes a plurality of board-supporting lower platforms at each of said first and second housing sides, each lower platform having at least one primarily upwardly-facing board-supporting surface, with said board-supporting surfaces lying substantially in a common horizontal plane, and said housing including a plurality of steps each projecting up above said board-supporting surfaces;

said circuit board has opposite sides and has a plurality of apertures therein, with each of said circuit board sides being supported by a plurality of said board-supporting surfaces and with each of said plurality of apertures receiving one of said steps.

3. The IC card described in claim 2 wherein:

each of said steps forms a board-supporting surface region lying above said board-supporting surfaces, to enable the support of circuit boards at different heights.

4. The IC card described in claim 2 wherein:

said housing upper portion has at least one upper platform at each of said housing sides, with each upper platform having a primarily downwardly-facing board-engaging surface lying between two of said lower platforms and engaging said circuit board.

each of said board-engaging surfaces lies at a height that is slightly below said board-supporting surfaces;

said circuit board has a first side which extends between and lies on said board-supporting surfaces of said lower platforms and that is downwardly-deflected by said board-engaging surface of one of said upper platforms.

5. An IC card housing which includes width-spaced opposite sides, length-spaced front and rear ends, and thickness-spaced top and bottom cover portions, wherein said thickness is much less than said width and than said length and said cover portions are electrically conductive, characterized by:

said housing comprises first and second housing halves, each molded to its shape and formed primarily of electrically conductive material, with said first housing half integrally forming a first of said cover portions and at least about half of one of said sides, and said second housing half forming the second of said cover portions;

each of said sides includes a vertical outer wall and at least one platform part lying inside of the vertical outer wall, said platform part having a plurality of steps of different heights, whereby to enable mounting of a circuit board on a selected one of said steps to select the height of the circuit board.

6. An IC card housing which includes width-spaced opposite sides, length-spaced front and rear ends, and thickness-spaced top and bottom cover portions, wherein said thickness is much less than said width and than said length, characterized by:

said housing comprises first and second housing halves, with said first housing half forming a first of said cover portions and at least about half of one of said sides, and said second housing half forming the second of said cover portions;

a circuit board assembly lying in said housing and including a circuit board having upper and lower board faces;

said first and second housing halves respectively have lower and upper pluralities of platform parts that respectively engage said lower and upper circuit board faces, with said platform parts lying along said housing sides, and with said lower and upper platform parts being staggered along each of said sides.

7. The IC card housing described in claim 6 wherein:

said circuit board has edge portions that lie respectively above and below portions of different of said platform parts;

said upper and lower platform parts have upper and lower board-face engaging surfaces which engage said circuit board and which are vertically spaced by less than the thickness of a corresponding board edge portion, to tightly engage said board.

8. The IC card housing described in claim 6 wherein:

each of said lower platform parts has at least two steps including an upper first step and a lower second step, and said circuit board has a plurality of slots that each have a slot length to closely receive one of said steps.

9. An IC card which includes a housing and a circuit board assembly with a ground conductor lying in said housing, said housing including opposite sides, front and rear ends, and top and bottom cover portions, wherein said cover portions are electrically conductive, and at least one of said sides has a conductive part on its outside which is connected to said ground conductor of said circuit board, characterized by:

said housing comprises upper and lower housing halves, each molded to its shape and formed primarily of at least one electrically conductive polymer;

each of said housing halves includes one of said cover portions and a pair of opposite flanges that each forms part of one of said sides, said circuit board ground conductor being electrically connected to at least one of said housing halves, and said housing halves being joined together at said flanges to enclose said circuit board;

said circuit board has upper and lower surfaces;

said lower housing half has at least one platform part with an upwardly-facing board-engaging surface, and said upper housing half has at least one platform part with a downwardly-facing board-engaging surface;

said board-engaging surfaces being positioned so each engages a different one of said board surfaces;

said circuit board has a predetermined board thickness and has a length along a longitudinal direction, and said downwardly-facing surfaces are spaced longitudinally from said upwardly-facing surfaces, and said downwardly-facing surfaces are vertically spaced from said upwardly-facing surfaces by less than said predetermined board thickness to cause bending of the circuit board.

10. An IC card which includes a housing, a circuit board assembly lying in said housing, said circuit board assembly including a circuit board having upper and lower faces and a plurality of electrical elements mounted on said board and projecting from at least one face thereof, and said housing including upper and lower cover portions, first and second opposite sides and longitudinally spaced first and second opposite ends, characterized by:

said housing includes upper and lower halves respectively including said upper and lower cover portions;

said housing lower half includes at least two board-supporting lower platform parts at said first side, each platform part having at least one primarily upwardly-facing board-supporting surface, said platform parts being longitudinally spaced apart;

said housing upper half has at least one upper platform part having a first primarily downwardly-facing board-supporting surface lying longitudinally between said lower platform parts;

each of said lower platform parts has a plurality of steps forming upwardly-facing board-engaging surfaces of different heights, to hold said circuit board at different heights within said housing:

said upper platform part has a plurality of steps with downwardly-facing board-engaging surfaces of different heights.

11. An IC card which includes a housing and a circuit board assembly lying in said housing, said housing having upper and lower housing halves that respectively form upper and lower cover portions, said housing having opposite sides, and said cover having longitudinally spaced front and rear ends with a connector at said front end, characterized by:

said circuit board assembly includes a circuit board with forward and rearward portions, upper and lower board faces, a board outer edge, and a board outer peripheral portion lying adjacent to said board outer edge;

each of said housing halves has a plurality of longitudinally spaced platform portions at each of its sides and integral with the corresponding cover portions, including platform portions closer to said housing front end than to said rear end and platform portions closer to said housing rear end than to said front end, and said platform portions lie against said board outer peripheral portion and clamp forward and rearward portions of the opposite sides of said board in place on the rest of said housing.

12. An IC card which includes a housing that has upper and lower housing halves and a circuit board assembly that includes a circuit board and that lies in said housing, said housing having opposite housing sides with one of said housing sides having an exposed conductive part that is exposed at the outside of said housing, said housing having longitudinally spaced front and rear ends and including a connector at said front end, and said upper and lower housing halves respectively form top and bottom cover portions, characterized by:

said circuit board has upper and lower board faces, has a board outer edge, has a board outer peripheral portion lying adjacent to said board outer edge, and has an electrically conductive ground conductor with a peripheral ground portion lying on said lower board face at said board outer peripheral portion;

each of said housing halves has a plurality of platforms including a platform at each of its sides that presses against said board outer peripheral portion and that holds said board in place on the rest of said housing;

a first of said platforms has a conductive platform surface which lies against said peripheral ground portion and which is electrically connected to said exposed conductive part of one of said housing sides, to both support and electrically ground said circuit board ground plane.

13. The IC card described in claim 12 wherein:

said housing halves are each formed of electrically conductive material, and said first of said platforms is formed of said electrically conductive material and is integral with said housing half which forms said exposed conductive part of the housing side.

* * * * *